United States Patent
Hackenberger et al.

(10) Patent No.: US 7,969,073 B2
(45) Date of Patent: Jun. 28, 2011

(54) TANGENTIALLY POLED SINGLE CRYSTAL RING RESONATOR

(75) Inventors: Wesley S. Hackenberger, State College, PA (US); Kevin A. Snook, State College, PA (US)

(73) Assignee: TRS Technologies, Inc., State College, PA (US)

( * ) Notice: Subject to any disclaimer, the term of this patent is extended or adjusted under 35 U.S.C. 154(b) by 312 days.

(21) Appl. No.: 12/338,813

(22) Filed: Dec. 18, 2008

(65) Prior Publication Data

US 2010/0321133 A1  Dec. 23, 2010

Related U.S. Application Data

(60) Provisional application No. 61/052,928, filed on May 13, 2008, provisional application No. 61/014,505, filed on Dec. 18, 2007.

(51) Int. Cl.
*H01L 41/08* (2006.01)

(52) U.S. Cl. ........................................................ 310/357

(58) Field of Classification Search .................. 310/358, 310/359, 371, 360, 365, 366, 369, 337, 367, 310/361; 252/62.9 PZ, 62.9 R; 117/71–72; 333/197; *H01L 41/187*
See application file for complete search history.

(56) References Cited

U.S. PATENT DOCUMENTS

| | | | |
|---|---|---|---|
| 6,465,937 B1 * | 10/2002 | Chen et al. | 310/360 |
| 2006/0091353 A1 * | 5/2006 | Matsushita et al. | 252/62.9 R |

* cited by examiner

*Primary Examiner* — Walter Benson
*Assistant Examiner* — Karen Addison
(74) *Attorney, Agent, or Firm* — McNees Wallace & Nurick LLC

(57) ABSTRACT

A tangentially poled piezoelectric single crystal ring resonator is disclosed. A single crystal material is machined into elements and formed into a ring structure. The single crystal elements have a <110> poled tangential axis. The elements may also have a <211>, <511> or <322> orientation range in the radial direction. The elements may have a generally wedge shape.

14 Claims, 3 Drawing Sheets

TANGENTIALLY POLED SINGLE CRYSTAL RING RESONATOR

CROSS-REFERENCE TO RELATED APPLICATIONS

This application claims priority to U.S. Provisional Patent Application No. 61/014,505 filed on Dec. 18, 2007, entitled "TANGENTIALLY POLED SINGLE CRYSTAL RING RESONATOR" and U.S. Provisional Patent Application No. 61/052,928 filed on May 13, 2008, entitled "TANGENTIALLY POLED SINGLE CRYSTAL RING RESONATOR", which are herein incorporated by reference in their entirety.

STATEMENT OF FEDERALLY SPONSORED RESEARCH

This invention was made with Government support under Navy contract #N00014-07-M-0304 entitled "Submarine Launched Acoustic Communication Buoy Using Single Crystal Sonar".

FIELD OF THE INVENTION

The present invention is directed generally to resonators, and more particularly to ring resonators used for radiating and/or detecting acoustical energy.

BACKGROUND

Low frequency omnidirectional projectors are an integral part of current sonar systems, including buoys, tethered projectors and mounted systems in submarines. Small diameter systems are used to project a very broadband, very high source level acoustic signal into the water to be as effective as possible. One type of projector utilizes an omnidirectional signal, of which ring shaped transducers are used in a radial or "hoop" mode by expanding and contracting the ring inner diameter and outer diameter uniformly and in phase. This resonance is excited by either poling through the ring wall thickness or circumferentially around the ring tangential to the ring's outer surface.

With conventional ceramic ring transducers, such as lead zirconate titanate (PZT-4, Navy Type 1), the piezoelectric projector is relatively large in volume and requires a high power input, due to the relatively low electromechanical coupling, high stiffness and low piezoelectric coefficients of the ceramic material. This strains the design requirements for packaging length, weight, and battery power, leaving insufficient reserve for the insertion of mobility and full duplex capability for improved countermeasure effectiveness in new torpedo applications. The large volume of these ceramic transducers is due in part to the need of multiple ceramic component rings, each of which is a different size in the transducer, which are necessary to provide the bandwidth required of the transducer. Each of these rings requires a separate drive component, which further increases the footprint of the projector system.

In an attempt to solve the problems associated with ceramic ring transducers, single crystal ring transducers were formed using wedge shaped bodies of single crystal material, for example $Pb(Mg_{1/3}Nb_{2/3})_{1-x}Ti_xO_3$ (PMN-PT), in a ring-approximation oriented along the <001> crystallographic orientation, glued together with electrode shims in between. The angled sides of the wedge shaped bodies are electroded with a conductive layer such as gold, and the bodies are glued together with conductive shims between each wedge shaped body.

The <001> orientation is traditionally considered the highest piezoelectric mode, providing the highest electromechanical coupling, and therefore largest bandwidth, for the single crystal material. This orientation eliminated the assumed non-uniform angular pressure field pattern from a circular single crystal ring, due to the anisotropy of the crystal around the circumference. In this wedge approach, the crystal wedges were poled such that the applied field was tangential to the ring, as with the circular ceramic rings.

Single crystal wedges are used because the anisotropy of PMN-PT could potentially reduce the omnidirectional behavior of the overall ring, and the wedges operate close to the 33-mode which provides an electromechanical coupling near 90%. Based on the height of the rings, the pure 33-mode is not generally achieved because the aspect ratio (width to thickness) is not above 3:1, and the width to wedge height is not above 3:1. Also, the overall diameter of the ring must be increased to achieve lower frequencies, and currently there is a practical limit as to how large a single ring of the single crystal can be formed.

Therefore, what is needed is a single crystal ring resonator having increased bandwidth allowing for more flexibility in duplexing, source level and/or better resolution, which does not suffer from the drawbacks of the prior art.

SUMMARY

According to an exemplary embodiment of the invention, a ring resonator having a <110> poled tangential axis is disclosed that includes a plurality of single crystal elements formed of a single crystal material and having a <110> first orientation in the poling axis.

According to another exemplary embodiment of the invention, a method of making a ring resonator is disclosed that includes forming a plurality of elements of a single crystal material, depositing conductive layers on two poling surfaces of each element of the plurality of elements, and bonding electrodes between the deposited conductive layers of adjacent elements to form the ring resonator.

Other features and advantages of the present invention will be apparent from the following more detailed description of exemplary embodiments, taken in conjunction with the accompanying drawings which illustrate, by way of example, the principles of the invention.

DETAILED DESCRIPTION OF THE INVENTION

The present invention now will be described more fully hereinafter with reference to the accompanying drawings. This invention may, however, be embodied in many different forms and should not be construed as limited to the embodiments set forth herein; rather, these embodiments are provided so that this disclosure will be thorough and complete and will fully convey the scope of the invention to those skilled in the art.

Electromechanical coupling properties of PMN-PT single crystal material were investigated in U.S. Pat. No. 6,465,937 ('937 Patent), incorporated herein by reference in the entirety. From the raw data presented in the '937 Patent, the inventors have determined that a ring resonator having electromechanical coupling properties may be improved with crystallographic orientations other than the <001> orientation.

Figure 1:
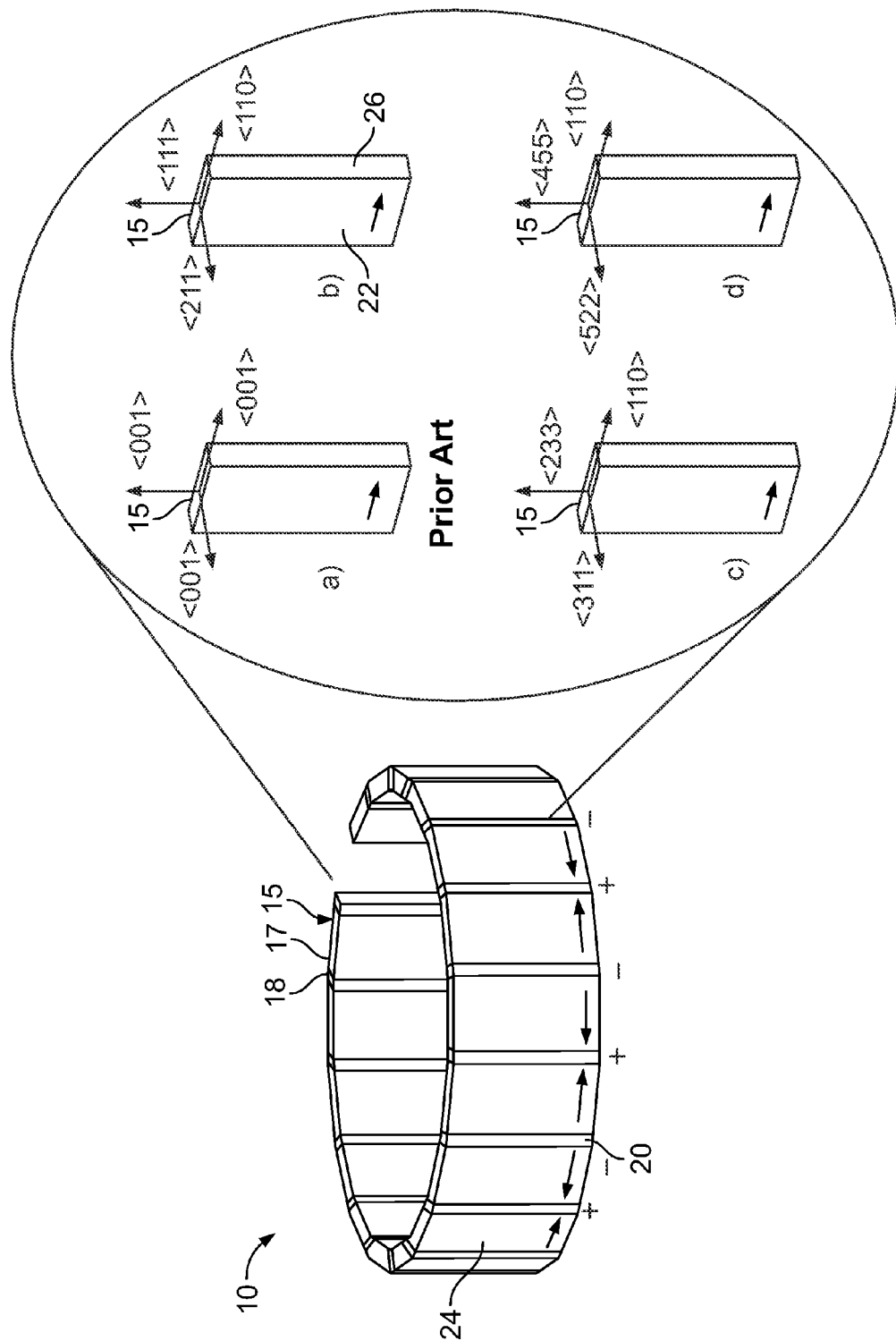
FIG. 1 shows a schematic of a tangentially poled ring resonator according to the prior art (a) and exemplary embodiments of the invention as shown in (b), (c) and (d).

Referring to FIG. 1., an exemplary embodiment of a ring resonator 10 according to the disclosure is shown. As shown in FIG. 1, the ring resonator 10 includes a plurality of elements 15 separated by electrodes 20. The relative dimensions of elements 15 and electrodes 20 in FIG. 1 are illustrative only, and have been exaggerated for discussion purpose only. In one embodiment, the plurality of elements 15 are four or more elements 15. In another embodiment, the plurality of elements 15 are 4 to about 40 elements 15. In yet another embodiment, the plurality of elements 15 are between about 8 and about 20 elements 15. In still yet another embodiment, the plurality of elements 15 are between about 10 and about 15 elements.

The elements 15 include single crystal bodies 17 formed of a single crystal material. The single crystal material may be a PMN-PT, PZN-PT, PIN-PT or other known single crystal ferroelectric or piezoelectric material. For example, the single crystal material may be $Pb(Mg_{1/3}Nb_{2/3})_{0.7}Ti_{0.3}O_3$. The single crystal bodies 17 are formed by machining a solid body of a single crystal material to approximately the desired dimension of the elements 15. The solid body of single crystal material may be a boule slice or billet of single crystal material.

The wedges 15 further include electrically conductive layers 18 applied to facing surfaces (not shown) of wedge bodies 17 so as to be disposed between the wedge bodies 17 and electrodes 20. The electrically conductive layers 18 are formed of an electrically conductive material. The electrically conductive layers 18 have a thickness of between about 2,000 Å and about 3,000 Å. In one embodiment, the electrically conductive material may be a metal or metal alloy. In another embodiment, the electrically conductive material may be gold, silver, platinum, chromium, copper, beryllium, nickel or an alloy thereof, such as brass. In another embodiment, the electrically conductive material may be a combination of layers of a conductive metal or material such as chrome/gold or nickel/vanadium. The conductive material is applied by known coating methods, including, but not limited to painting, chemical vapor deposition, sputtering, or electroless plating.

The electrodes 20 are formed of a sheet or plate of another electrically conductive material. The electrodes 18 have a thickness of between about 25 μm and 100 μm. In one embodiment, the electrodes 18 have a thickness of between about 40 μm and about 60 μm. In another embodiment, the electrodes 18 have a thickness of about 50 μm. In one embodiment, the electrically conductive material may be a metal or metal alloy. In another embodiment, the electrically conductive material may be selected from a group including, but not limited to, gold, silver, platinum, chromium, copper, beryllium, nickel or an alloy thereof, such as brass.

In one embodiment, the electrodes 20 are bonded to opposing conductive layers 18 by an adhesive to form the ring resonator 10. The adhesive may be an epoxy or other known adhesive as appreciated in the art. In another embodiment, the electrode 20 may be deposited on one conductive layer 18 by a deposition process, such as but not limited to chemical vapor deposition, sputtering, and electroless plating. The electrode 20 is then bonded to an opposing conductive layer 18 by an adhesive to form the ring resonator 10.

The electrodes 20 are provided with alternating positive (+) and negative (−) voltages to polarize the elements 15 as shown in FIG. 1. In such a manner, the elements 15 have poling axes opposite to one another. The positive (+) and negative (−) voltage may be provided by connecting to positive (+) and negative (−) leads (not shown), which are further connected to an electrical source (not shown).

Referring to FIG. 1, the ring resonator 10 has a generally annular cross section having an outside diameter (OD) and inside diameter (ID). In one embodiment, the ring resonator 10 has an outside diameter of between about 0.5 inch and about 6 inches. In another embodiment, the ring resonator 10 has an outside diameter of between about 0.5 inch and about 3 inches. In another embodiment, the ring resonator 10 has an inside diameter between about 0.35 inch and about 5.9 inches. In one example, the ring resonator 10 has an outside diameter of about 0.5 inch and an inside diameter of between about 0.35 and about 0.40 inch. In another example, the ring resonator 10 has an outside diameter of about 3.0 inches and an inside diameter of between about 2.85 and about 2.9 inches. In still another example, the ring resonator 10 has an outside diameter of about 6 inches and an inside diameter of between about 5.75 inches and about 5.90 inches.

In this exemplary embodiment, the elements 15 have a generally wedge shape having a generally isosceles trapezoid cross section. The elements 15 include an inside face 22, an outside face 24, and poling faces 26. As can be appreciated from FIG. 1, the generally wedge shape facilitates the arrangement of the elements 15 into the generally annular cross section. In another embodiment, the elements 15 have a generally rectangular cross section. In this another embodiment, the electrodes 20 may have a generally wedge or triangular shape to facilitate the arrangement of the elements 15 into the generally annular cross section.

The ring resonator 10 is tangentially poled, as indicated by the arrows in FIG. 1, by providing a voltage across the electrodes 20 as shown. Tangentially poling the single crystal resonator 10 is significantly improvement over poling through the wall thickness as is done with conventional ceramic ring resonators, because the structure of the single crystal makes it more sensitive to internal lateral stresses that clamp the extensional resonance. Additionally, tangentially poling the ring resonator reduces lateral stresses as compared to poling through the wall thickness, which results in a much higher electromechanical coupling. Single crystal PMN-PT, unlike poled piezoelectric ceramics, exhibits a high level of anisotropy throughout the material. This is due to the structure of the crystal, which is different in each of the crystallographic directions.

As further shown in insert of FIG. 1, elements 15 may have different poling orientations. To date, only elements 15 in the <001> poling orientation of PMN-PT single crystal wedges as shown in FIG. 1a have been constructed. This invention uses single crystals having a <110> orientation along the width direction tangential to the ring (i.e. in the poling direction) and a <211>, <311> or <522> orientation in the radial direction, corresponding to a crystallographic orientation angle between 50° and 70° for the radial face, respectively.

Elements 15 having a <110> orientation in the tangential direction and a <211>, <311> or <522> orientation in the radial direction results in a larger ring size comparable to PZT ceramics, but with an electromechanical coupling equal to the highest values found in single crystals. The elements 15 may also maintain heights that are larger than the <001> orientation, and may be chosen independently of the width as long as the general requirement of height:width of >1.5:1 is met to provide the electromechanical coupling $k_{33}'$ mode. This feature reduces the number of individual ring resonators 10 that may be stacked in a given device.

Figure 2:
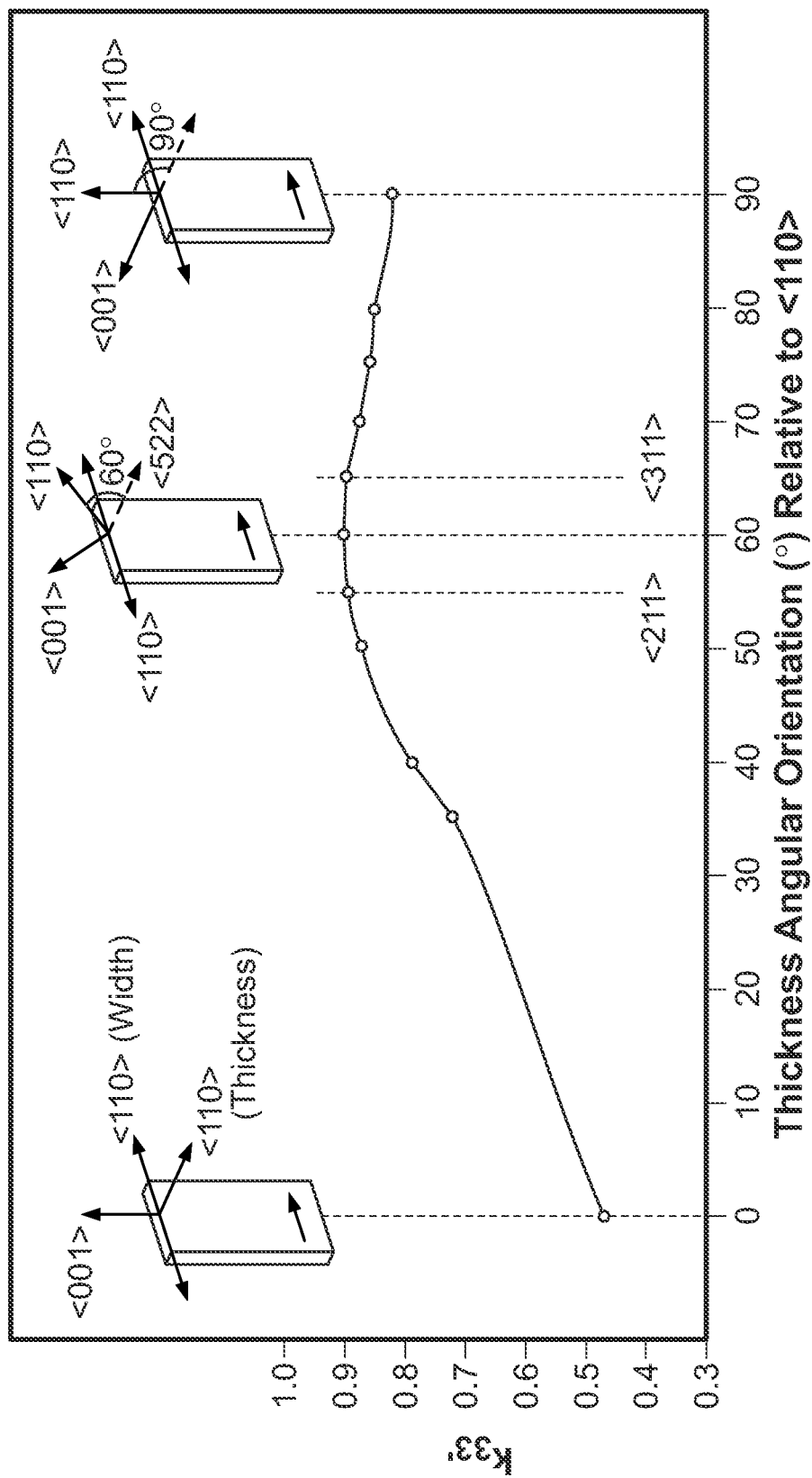
FIG. 2 illustrates coupling k33' vs. Thickness Angular Orientation(°) Relative to <110>.

FIG. 2 illustrates the relationship between effective electromechanical coupling $k_{33}'$ and orientation for a ring resonator having a tangential poling <110> axis. As can be seen in FIG. 2, the optimum angular orientation is between 50° and 70° for the <110> tangential orientation.

As can further be seen in FIG. 2, this orientation exhibits an effective electromechanical coupling $k_{33}'$ that equals or betters the traditional <001> $k_{33}$, while providing an additional degree of freedom when designing a ring resonator. The <001> element must be limited to specific aspect ratios between width, thickness and height, whereas the invention allows for an arbitrary height as long as it is at least about 1.5 times the width.

Figure 3A:
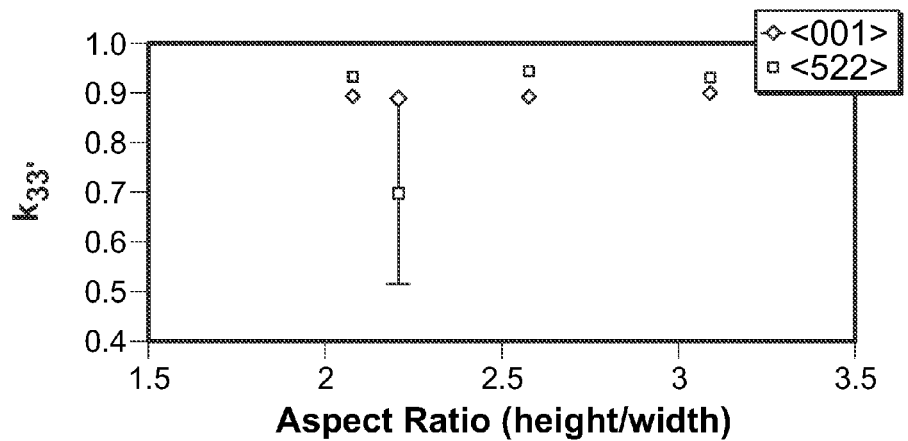
FIG. 3 illustrates results from bar testing showing comparison between <001> and <522> thickness oriented slivers.

FIG. 3A shows the results of a series of tests using different aspect ratios between the height and width, which were tested on individual elements having the <001> orientation on all faces, and with the <522> large face and <110> width orientation. As can be seen in FIG. 3, there is an improvement in electromechanical coupling from 90% for the <001> oriented pieces to 94% for the <110> width-oriented pieces. As can further be seen in FIG. 3, spurious modes are more evident in the <110>, which can affect the measured properties, as evident in the aspect ratio of 2.2.

Figure 3B:
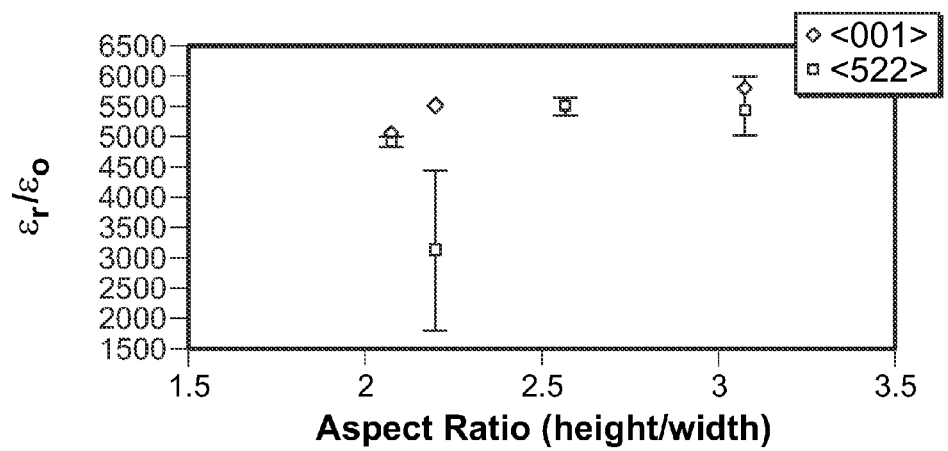
Figure 3C:
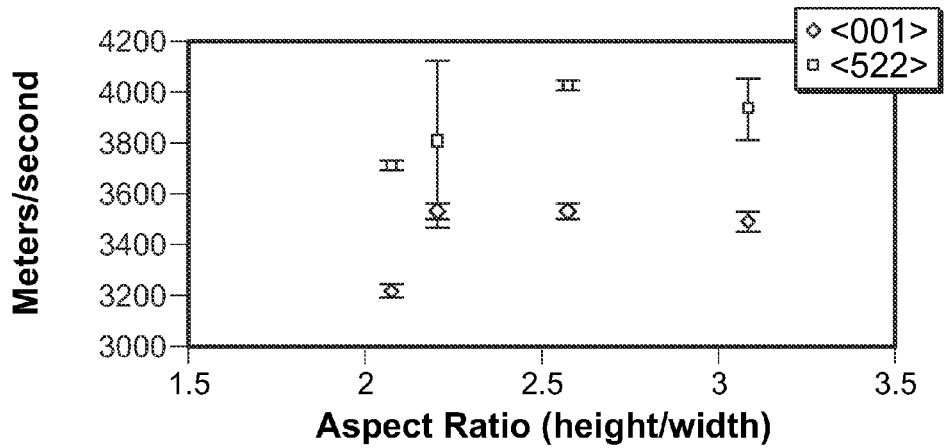

As can also be seen in FIG. 3B, some properties of the <522> are similar to the <001> pieces, and in particular, the free dielectric constant was nearly identical between the <522> and <001> samples. Additionally, as shown in FIG. 3C, the phase velocity within the samples did show an increase of approximately 15% in the <522> samples as compared to the <001> samples, which would result in an increase in diameter of a ring for a given resonance frequency.

While the invention has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

The invention claimed is:

1. A ring resonator having a <110> poled tangential axis, comprising:
   a plurality of single crystal elements formed of a single crystal material and having a <110> first orientation in the poling axis.

2. The ring resonator of claim 1, wherein
   the plurality of single crystal elements further comprise a second orientation in a radial axis, the second orientation selected from the group consisting of a <211> orientation, a <522> orientation, and a <311> orientation.

3. The ring resonator of claim 2, wherein the second orientation is a <211> orientation.

4. The ring resonator of claim 2, wherein the second orientation is a <522> orientation.

5. The ring resonator of claim 2, wherein the second orientation is a <311> orientation.

6. The ring resonator of claim 1, wherein the single crystal material is a piezoelectric single crystal material.

7. The ring resonator of claim 1, wherein the piezoelectric single crystal material is selected from the group consisting of a PMN-PT, a PZN-PT and a PIN-PT single crystal material.

8. The ring resonator of claim 7, wherein the piezoelectric single crystal material is $Pb(Mg_{1/3}Nb_{2/3})_{0.7}Ti_{0.3}O_3$.

9. The ring resonator of claim 1, wherein the plurality of single crystal elements are between 4 and about 40 single crystal elements.

10. The ring resonator of claim 1, further comprising:
    a plurality of electrodes disposed between the plurality of single crystal elements.

11. The ring resonator of claim 1, wherein each single crystal element of the plurality of single crystal elements comprises an element body having two poling surfaces facing the <110> poled tangential axis and a conductive layer deposited on each of the two poling surfaces.

12. The ring resonator of claim 9, wherein the electrodes are disposed between conductive layers of two adjacent single crystal elements.

13. The ring resonator of claim 1, wherein each single crystal element of the plurality of single crystal elements has a generally wedge shape.

14. The ring resonator of claim 1, wherein each single crystal element of the plurality of single crystal elements has a height:width of >1.5:1.

* * * * *